United States Patent [19]

Suzuki

[11] 3,939,435
[45] Feb. 17, 1976

[54] POWER AMPLIFIER

[75] Inventor: Tadao Suzuki, Tokyo, Japan

[73] Assignee: Sony Corporation, Tokyo, Japan

[22] Filed: Sept. 17, 1973

[21] Appl. No.: 397,792

[30] Foreign Application Priority Data
Sept. 21, 1972 Japan.................. 47-109959[U]

[52] U.S. Cl................ 330/51; 307/241; 330/30 R; 330/124 R
[51] Int. Cl.²........................... H03F 1/14
[58] Field of Search.............. 307/241, 242, 243; 330/30 R, 51, 124 R; 328/103

[56] References Cited
UNITED STATES PATENTS

| | | | |
|---|---|---|---|
| 2,464,353 | 3/1949 | Smith et al.................. | 330/51 X |
| 2,928,982 | 3/1960 | Sprengeler................... | 328/103 X |
| 3,213,198 | 10/1965 | Claras et al.................. | 330/124 X |

*Primary Examiner*—R. V. Rolinec
*Assistant Examiner*—Lawrence J. Dahl
*Attorney, Agent, or Firm*—Lewis H. Eslinger; Alvin Sinderbrand

[57] ABSTRACT

A power amplifier device comprised of at least two amplifying circuits, each including an input, at least one voltage amplifier stage, at least one power amplifier stage adapted for signal impedance conversion, and an output, all connected in series, and further including a signal input terminal and a signal output terminal. Plural switch means are provided for selectively interconnecting the voltage amplifier stages and the power amplifier stages of the amplifying circuits for selectively establishing a parallel connected amplifying circuit, individual amplifying circuits and a balanced transformerless connection across the signal output terminals. In the parallel connected amplifying circuit, the plural switch means are operated to connect the amplifying circuit inputs in parallel, the amplifying circuit outputs in parallel and the respective amplifier stages and the respective power amplifier stages of the amplifying circuits in parallel. In the individual amplifying circuits, the plural switch means are operated to connect the amplifying circuit inputs and the amplifying outputs to corresponding signal input terminals and signal output terminals, respectively. In the balanced transformerless connection, the plural switch means are operated to connect a first amplifying circuit output to a second amplifying circuit input and to connect the amplifying circuit outputs to respective signal output terminals.

11 Claims, 5 Drawing Figures

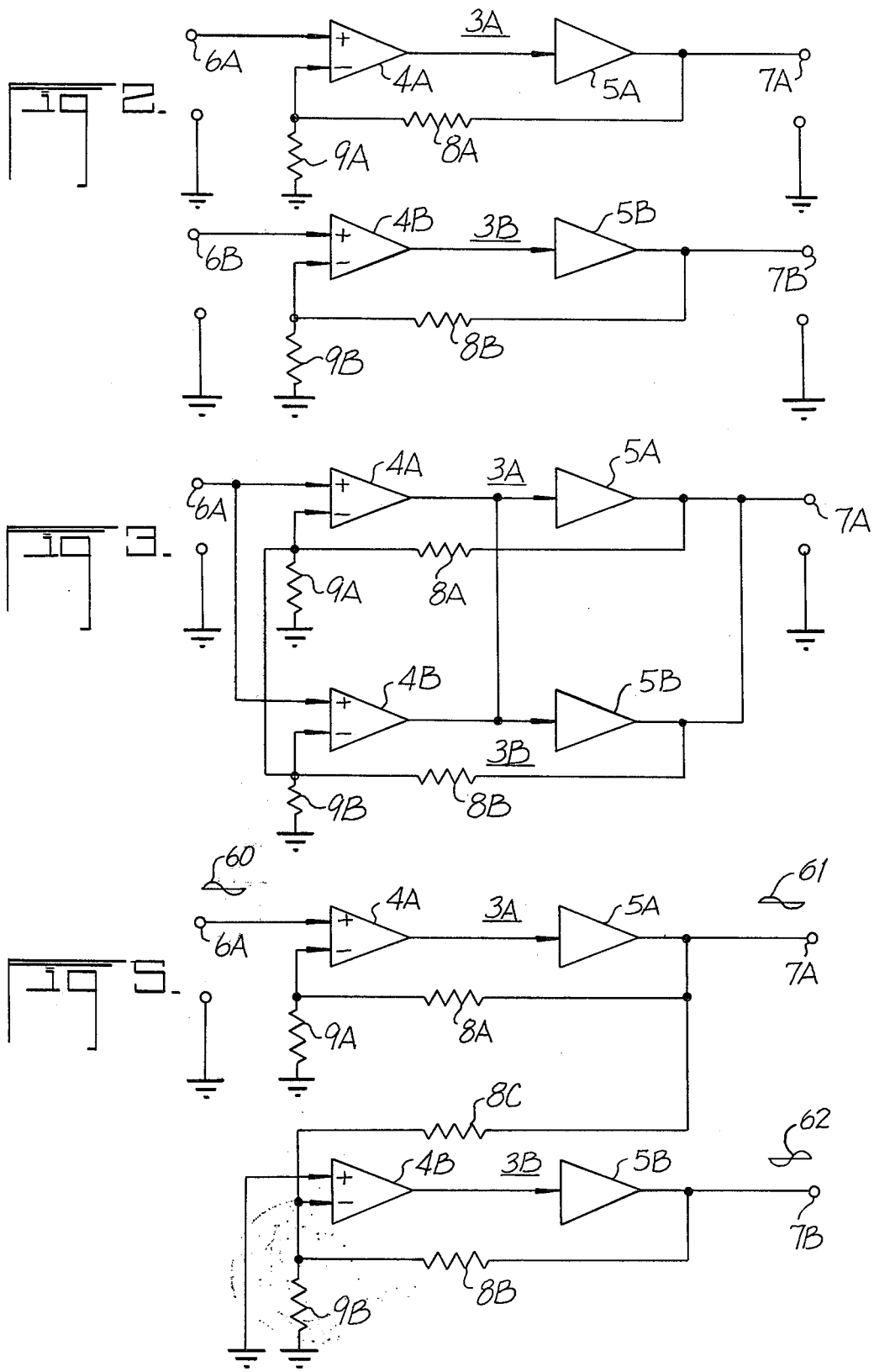

POWER AMPLIFIER

BACKGROUND OF THE INVENTION

This invention relates to power amplifiers and, in particular, to an improved power amplifying device capable of assuming selected circuit configurations.

In general, a typical power amplifier may consist of a series circuit comprised of a voltage amplifying stage for increasing the level of a signal applied thereto from a signal source and an impedance converting stage for changing the impedance presented to the amplified signal. In some instances, the impedance converting stage preferably has a high input impedance and relatively low output impedance. A typical example of such impedance converting stage is the emitter-follower amplifier. Since the gain of conventional voltage amplifying stage as well as the gain of a conventional impedance converting stage are susceptible to variations, the output signal level and output impedance of the power amplifier might correspondingly vary. Accordingly, if two power amplifiers are connected in parallel relation, the possible mismatch in gains and output impedance of the amplifiers might result in undesirable loading effects. In many applications, the output impedance of a power amplifier is selected to be relatively low. Thus, if two such power amplifiers are connected in parallel relation, the low output impedance of one such amplifier may present a load to the other amplifier thereby creating the possibility of an overload condition which could result in deleterious operation of the parallel configuration and quite possibly, serious damage to the overloaded power amplifier.

In other applications, the amplified signal produced by one conventional power amplifier might be supplied as an input signal to the other conventional power amplifier. The two power amplifiers operate upon the signals applied thereto so as to produce a pair output amplified signals admitting of opposite phases. If a load is coupled across the respective output terminals of the two power amplifiers, the resulting configuration is the so-called balanced transformer less connection. In the balanced transformerless connection, the load is connected in series to both power amplifiers. Accordingly, the load is provided with oppositely phased amplfied signals. The effective load applied to each power amplifier may be considered to be one-half of the total load. Hence, a balanced transformerless connection across a load is a useful circuit configuration for supplying an amplified signal to the load for those applications wherein the load is large. However, if the load coupled to the balanced transformerless connection is relatively small, the power amplifiers may then be subjected to undesirable loading effects which could result in damage to the amplifiers.

In those power amplifiers that include a voltage amplifyihng stage and a power amplifying or impedance converting stage, the voltage amplifying stage generally operates as a class A amplifier and the impedance converting stage that converts the impedance presented to the amplified signal from a high value to a low value generally operates as a Class B amplifier.

OBJECTS OF THE INVENTION

Therefore, it is an object of the present invention to provide a multi-purpose power amplifier.

It is another object of the present invention to provide a power amplifier including at least two power amplifying circuits adapted for interconnection wherein one of such interconnected power amplifying circuits does not load the other power amplifying circuit.

A further object of the invention is to provide a power amplifier having a plurality of amplifying stages and a plurality of selecting switches for selectively interconnecting the amplifying stages to selectively establish plural circuit configurations.

Yet another object of the present invention is to provide a power amplifier having plural stages and plural selecting switches capable of interconnecting the amplifier stages to selectively establish plural individual amplifying circuits, a parallel connected amplifying circuit and a balanced transformerless load supplying circuit.

It is further object of the instant invention to provide a power amplifier that may be effectively and safely operated with high and low impedance loads.

An additional object of the present invention is to provide a power amplifier admitting of relatively simple construction and uncomplicated connections.

A still further object of the present invention is to provide a low cost power amplifier that may be selectively operated in any of plural circuit configurations in the absence of adverse loading effects thereon.

Various other objects, advantages of the invention will become clear from the detailed description set forth hereinbelow.

SUMMARY OF THE INVENTION

In accordance with the present invention a power amplifier is provided including a plurality of voltage amplifying means and a like plurality of signal impedance converting means; a plurality of selecting means is provided to selectively interconnect the voltage amplifying means and the signal impedance converting means in any one of a plurality of circuit configurations to selectively establish independent power amplifiers, a parallel connected power amplifier and a balanced transformerless connection for supplying a load impedance.

BRIEF DESCRIPTION OF THE DRAWINGS

The detailed description set forth hereinbelow will be readily understood by referring to the accompanying drawings in which:

FIG. 2 is a schematic diagram representing one of the circuit configurations obtainable in accordance with the reachings of the present invention;

FIG. 3 is a schematic diagram of another circuit configuration which is obtainable by the power amplifier of the present invention;

FIG. 5 is a schematic diagram of a still further circuit configuration obtainable by the power amplifier in accordance with the teachings of the present invention.

DETAILED DESCRIPTION OF A PREFERRED EMBODIMENT

Figure 1:
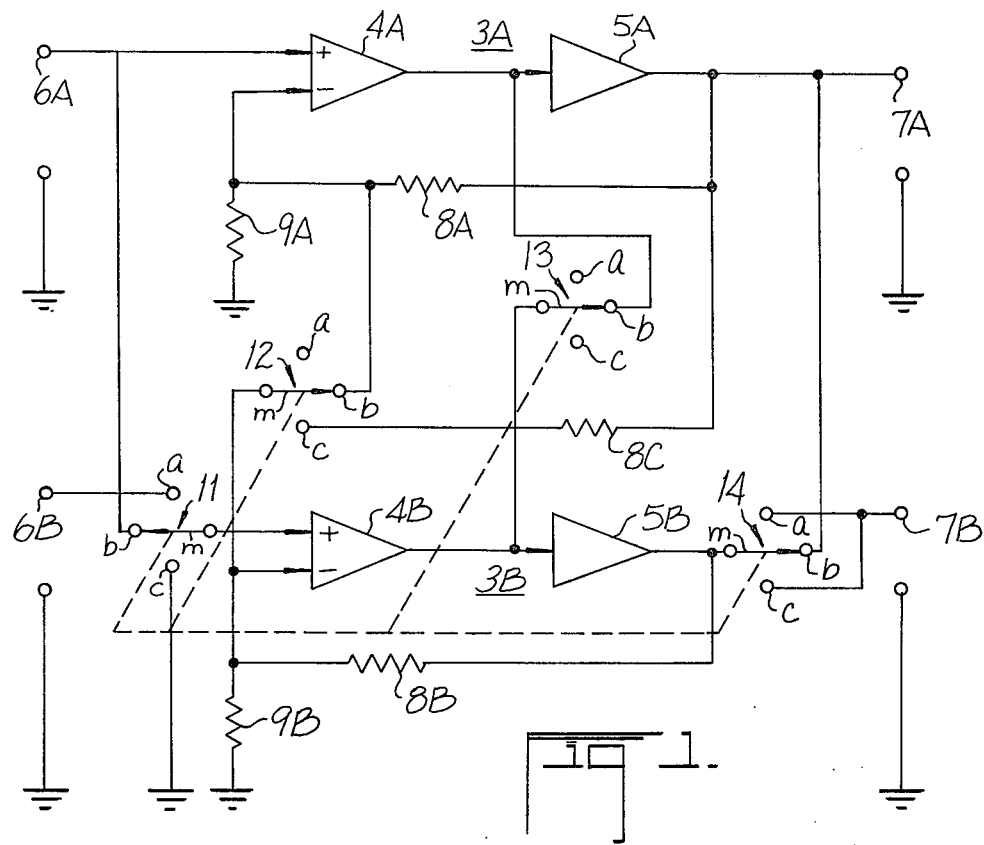
FIG. 1 is a schematic diagram of a preferred embodiment of a power amplifier in accordance with this invention.

Referring to FIG. 1, a power amplifying device is schematically illustrated comprised of at least two amplifying circuits 3A and 3B. To simplify the following description, only two amplifying circuits are depicted. However, it should be readily apparent that any convenient number of amplifying circuits may be employed. The amplifying circuits 3A and 3B are substantialy identical, each including at least one voltage amplifier stage 4A and 4B, respectively, having a high output impedance and a series connected impedance converting stage 5A and 5B, respectively. The voltage amplifier stage, also referred to as a driver stage, may comprise a conventional class A amplifier. The voltage amplifier stage may be a conventional operational amplifier including a common emitter output to thereby provide the preferably high output impedance. The impedance converting stage 5A, 5B is also referred to as a power amplifier stage and preferably has a high input impedance and a low output impedance to thereby convert the effective impedance presented to the amplified signal from a high level to a low level. The impedance converting stage may comprise a conventional class B amplifier and, as will soon be described hereinbelow, may comprise an emitter-follower amplifier. Signal input terminals 6A and 6B are provided to receive signals for amplification and are adapted to supply the received signals to the respective amplifying circuits 3A and 3B, respectively. Signal input terminal 6A is connected to the voltage amplifier stage 4A and, as will soon be described, may be selectively connected to the voltage amplifying stage 4B. If the voltage amplifier stage 4A is comprised of a conventional operational amplifier having inverting and noninverting input terminals, the signal input terminal 6A is preferably coupled to the noninverting input terminal of the voltage amplifying stage. Similarly, if voltage amplifying stage 4B comprises a conventional operational amplifier having inverting and noninverting input terminals, the signal input terminal 6B is selectively coupled to the noninverting input terminal.

Each amplifying circuit 3A and 3B is provided with a feedback resistor 8A and 8B, respectively, for intercoupling the output of the respective impedance converting stages 5A and 5B with the respective inputs to the voltage amplifying stages 4A and 4B. If the voltage amplifying stages comprise conventional operational amplifiers, as aforenoted, the feedback resistors 8A and 8B are preferably coupled to the inverting input terminals thereof. Additionally, each inverting input terminal is coupled to a reference potential, such as ground through respective resistors 9A and 9B. Additionally, signal output terminals 7A and 7B are coupled to the respective amplifying circuits 3A and 3B. More particularly, the output of impedance converting stage 5A is coupled to signal output terminal 7A and the output of the impedance converting stage 5B is selectively coupled to the signal output terminal 7B in a manner soon to be described.

Individual loads may be coupled between signal output terminal 7A and ground and between signal output terminal 7B and ground, respectively. When each amplifying circuit 3A and 3B is disposed for independent operation, an input signal supplied to a signal input terminal 6A or 6B is amplified by a voltage amplifying stage 4A or 4B and the signal impedance, i.e., the impedance presented to the amplified signal, is converted from a high value to a lower value by the impedance converting stage 5A or 5B and the low impedance signal is then applied to an appropriate load coupled to a signal output terminal 7A or 7B.

In accordance with a preferred embodiment of the present invention, selecting switches 11–14 are provided, together with appropriate connecting leads, to permit plural circuit configurations to be selectively established between the various stages of the amplifying circuits 3a and 3B. As illustrated, selecting switch 11, which may comprise a conventional multi-position rotary switch, is provided with a stationary contact $a$ coupled to signal input terminal 6B, a stationary contact $b$ coupled to signal input terminal 6A and a stationary contact $c$ coupled to ground. A movable contact $m$, adapted to selectively engage each of the stationary contacts, is coupled to an input of the voltage amplifying stage 4B. Preferably, if the voltage amplifying stage comprises a conventional operational amplifier, the movable contact $m$ is coupled to the noninverting input terminal of the operational amplifier.

Selecting switch 12 is substantially similar to the aforedescribed selecting switch 11 and includes an electrically isolated stationary contact $a$, a stationary contact $b$ coupled to an input of the voltage amplifying stage 4A and a stationary contact $c$ coupled to the output of the impedance converting stage 5A through a resistor 8C. Although stationary contact $a$ is here not connected to further apparatus, it is appreciated that the stationary contact may be effectively electrically isolated by coupling such contact to ground through a very large resistor. If the voltage amplifying stage 4A comprises a conventional operational amplifier, stationary contact $b$ is preferably coupled to the inverting input terminal of the operational amplifier. The resistor 8C to which the stationary contact $c$ of selecting switch 12 is coupled is preferably of the same impedance value as the feedback resistor 8A or 8B. Selecting switch 12 further includes a movable contact $m$, adapted to selectively engage each of the stationary contacts, coupled to an input of the voltage amplifying stage 4B. If the voltage amplifying stage is comprised of a conventional operational amplifier, movable contact $m$ is preferably coupled to the inverting input terminal of the operational amplifier.

Selecting switch 13 is similar to aforedescribed selecting switch 11 and, accordingly, includes stationary contacts $a$, $b$ and $c$ and a movable contact $m$. Stationary contacts $a$ and $c$ are electrically isolated in a manner similar to that describe hereinabove with respect to stationary contact $a$ of selecting switch 12. The stationary contact $b$ of selecting switch 13 is coupled to the junction defined by the series connection of the voltage amplifying stage 4A and the impedance converting stage 5A. The movable contact $m$ of selecting switch 13 is coupled to the junction defined by the series connection of the voltage amplifying stage 4B and the impedance converting stage 5B. It is appreciated that selecting switch 13 is adapted to selectively shunt the outputs of the voltage amplifying stages included in the amplifying circuits 3A and 3B. Stated otherwise, the selecting switch 13 is adapted to selectively shunt the inputs of the impedance converting stages included in the amplifying circuits 3A and 3B.

The selecting switch 14 is similar to aforedescribed selecting switch 11 and, therefore, includes a plurality of stationary contacts $a$, $b$ and $c$ and a movable contact $m$. Stationary contacts $a$ and $c$ are connected in common relation to the signal output terminal 7B. The stationary contact $b$ of the selecting switch 14 is coupled to the signal output terminal 7A. It is apparent that the stationary contact *b* is thus coupled to the output of the amplifying circuit 3A. The movable contact *m* of the selecting switch 14 is adapted to selectively engage each of the stationary contacts and is coupled to the output of the amplifying circuit 3B.

The selecting switches 11–14 are adapted to selectively interconnect the voltage amplifying stages and the impedance converting stages of the amplifying circuits in accordance with the selective operation thereof. In one embodiment the selecting switches 11–14 are adapted for manual operation. However, as may be readily appreciated by those of ordinary skill in the art, the selecting switches may be electronic switches adapted to be regulated by conventional controlling apparatus, not shown. In the preferred embodiment illustrated herein, selecting switches 11–14 are operated in unison and, therefore, are ganged for the simultaneous operation thereof. In an alternative embodiment, the selecting switches are individually operated. In the simultaneous operation of the selecting switches, it is recognized that the movable contact *m* of each selecting switch engages a similarly identified stationary contact in accordance with the selective operation thereof. More particularly, if movable contact *m* of selecting switch 11 is positioned to engage stationary contact *a*, then the movable contact *m* of each of selecting switches 12, 13, and 14 is similarly positioned to engage a corresponding stationary contact *a*. Similarly, if the movable contact *m* of a selecting switch is positioned to engage the stationary contact *b* then the movable contacts of the remaining selecting switches likewise engage their corresponding stationary contacts *b*. And if the movable contact *m* of a selecting switch is positioned to engage its stationary contact *c*, the movable contacts *m* of the remaining selecting switches likewise engage their corresponding stationary contacts *c*. Of course, manual or electronic control may be provided to effect the selective positioning of the movable contacts.

In a first example let it be assumed that the movable contacts *m* of the selecting switches 11–14 are positioned to engage their corresponding stationary contacts *a*. Accordingly, individual amplifying circuits are provided such that the signal input terminal 6A is connected in series with the voltage amplifying stage 4A and the impedance converting stage 5A, the output of the impedance converting stage 5A being connected in series with the signal output terminal 7A. Similarly, a series circuit may be established from the signal input terminal 6B to stationary contact *a* of the selecting switch 11, to the voltage amplifying stage 4B by the movable contact *m* of the selecting switch 11, to the impedance converting stage 5B and to the signal output terminal 7B by the movable contact *m* and stationary contact *a* of the selecting switch 14. Since selecting switches 12 and 13 are here electrically isolated in accordance with the positioning of their respective movable contacts *m* at the isolated stationary contacts *a*, a representative schematic diagram of the resulting circuit configuration comprised of individual amplifying circuits may be depicted as in FIG. 2. As there illustrated, amplifying circuits 3A and 3B are electrically isolated, thus establishing individual series connected amplifying circuits from respective signal input terminals 6A and 6B through respective voltage amplifying stages and impedance converting stages to the respective signal output terminals 7A and 7B. The individual amplifying circuits are seen to be independently operable so as to find ready application as a stereophonic signal power amplifier operable upon the left channel signal (L-signal) and the right channel signal (R-signal). Thus, if the power amplifying device in accordance with the present invention is to be utilized as a stereophonic signal power amplifier, it is appreciated that the L-signal may be applied to signal input terminal 6A and the R-signal may be applied to the signal input terminal 6B. Appropriate load impedances, such as loudspeaker coils, or the like, may be provided at the signal output terminals 7A and 7B to receive the amplified L-signal and R-signal, respectively.

In a further example, let it be assumed that the movable contacts *m* of the selecting switches 11–14 are positioned to engage their corresponding stationary contacts *b*. In this configuration the inputs to each of amplifying circuits 3A and 3B are connected in parallel by selecting switch 11 and the outputs of the amplifying circuits are likewise connected in parallel by the selecting switch 14. The parallel connected amplifying circuit advantageously provides an increase in the power that may be supplied to a load. A representative schematic diagram of this configuration wherein a parallel connected amplifying circuit is established is depicted in FIG. 3. The selecting switch 13 serves to connect the outputs of the voltage amplifying stages 4A and 4B (or the inputs of the impedance converting stages 5A and 5B) of the respective amplifying circuits 3A and 3B in parallel. If each of the voltage amplifying stages is comprised of a conventional operational amplifier, it may be appreciated that the selecting switch 11 serves to connect the noninverting input terminals thereof in parallel and the selecting switch 12 serves to connect the inverting input terminals thereof in parallel. Thus, a signal provided at signal input terminal 6A is coupled in common to the voltage amplifying stages 4A and 4B and the respective amplified signals produced at the output of the amplifying circuits 3A and 3B are combined and supplied to the signal output terminal 7A. The selective positioning of the selecting switches 11 and 14 effectively removes the signal input terminal 6B and the signal output terminal 7B from the amplifying circuit 3B.

It is recalled that the output impedances of the respective voltage amplifying stages 4A and 4B are preferably high. Accordingly, the parallel connection of the outputs of the voltage amplifying stages does not present an undesired loading of one stage by the other parallel connected stage. The amplified signals produced by each voltage amplifying stage are coupled to the corresponding impedance converting stages in the absence of significant loading effects which could otherwise present a hazard to the operation of the parallel connected amplifying circuits.

Figure 4:
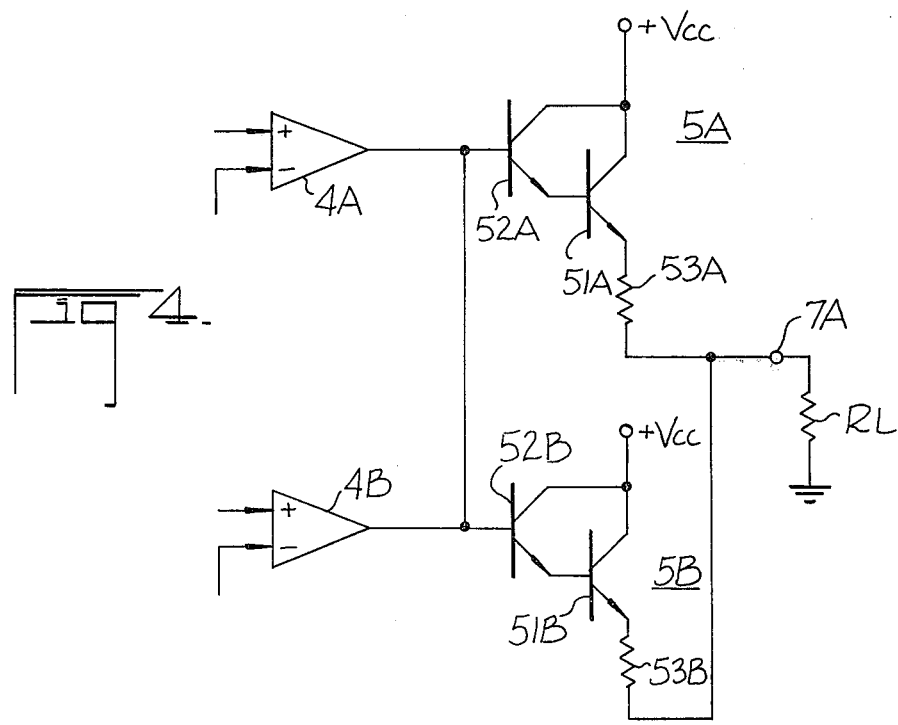
FIG. 4 is a schematic diagram representing a portion of one embodiment of the power amplifier of the present invention.

The parallel connection between the outputs of the impedance converting stages 5A and 5B, effected by selecting switch 14, is not accompanied by serious loading effects. This obtains because, preferably, each impedance converting stage admits of a high input impedance and a low output impedance. One typical embodiment of an impedance converting stage that may be employed with the present invention is depicted in FIG. 4 which schematically illustrates a portion of the parallel connected amplifying circuit comprised essentially of the parallel connections between the impedance converting stages 5A and 5B. The conventional emitter-follower is a satisfactory device that may be readily used as an impedance converting stage. The emitter-follower configuration is illustratively comprised of a power transistor supplied by a drive transistor. More particularly, the impedance converting stage 5A is provided with power transistor 51A having an emitter resistor 53A and a drive transistor 52A. The collectors of the respective transistors are connected in common to a suitable source of energizing potential + $V_{cc}$ and the emitter of the drive transistor 52A is coupled to the base electrode of the power transistor 51A in the recognized Darlington configuration. The base electrode of the drive transistor 52A is supplied with the signal amplified by the voltage amplifying stage 4A.

The impedance converting stage 5B is similarly comprised of a power transistor 51B having an emitter resistor 53B and being driven by drive transistor 52B. The latter transistor is supplied with the amplified signal produced by the voltage amplifying stage 4B and, additionally, is connected in parallel to the base electrode of the drive transistor 52A of impedance converting stage 5A. The output of each emitter-follower circuit is supplied to a load depicted as an impedance $R_L$ coupled to signal output terminal 7A.

It is appreciated that the parallel connected outputs of the voltage amplifying stages assures that the base-emitter voltage applied to each of the illustrated emitter-follower circuits is substantially the same. The particular transistors and emitter resistors of the impedance converting stages may be properly selected so that the corresponding voltage drops thereacross in each emitter-follower circuit are substantially the same. Consequently, the emitter current flowing through the power transistor 51A and emitter resistor 53A to the signal output terminal 7A is substantially, the same as the emitter current flowing through the power transistor 51B and the emitter resistor 53B to the signal output terminal. It may therefore be appreciated that neither of the impedance converting circuits 5A and 5B presents an undesirable load to the other impedance converting stage. Thus, the load impedance $R_L$ may be supplied with relatively large amounts of power by the parallel connected power amplifying circuit in the absence of undersirable loading effects heretofore present in prior art power amplifier devices.

In yet another example let it be assumed that the movable contacts m of the selecting switches 11–14 are selectively positioned at their corresponding stationary contacts c. The resulting circuit includes the output of amplifying circuit 3A coupled to the input of amplifying circuit 3B by selecting switch 12 and selecting switch 14 couples the the output of amplifying circuit 3B to the signal output terminal 7B. Additionally, if the voltage amplifying stage 4B comprises a conventional amplifier, the noninverting input terminal thereof is coupled to ground potential by the selecting switch 11 and the inverting input terminal thereof is coupled to the output of the impedance converting stage 5A by the selecting switch 12. This circuit configuration may be seen to comprise a balanced transformerless connection that is clearly represented in the schematic diagram of FIG. 5. As illustrated, the output of amplifying circuit 3A is connected to the input of amplifying circuit 3B in a manner that permits a phase reversal of the signal amplified by circuit 3A. More particularly, if a signal 60 is supplied to the signal input terminal 6A it is appreciated that the voltage amplifying stage 4A and the impedance converting stage 5A sufficiently amplify the input signal to produce an amplified signal 61 at the signal output terminal 7A. Amplifying circuit 3A preferably provides no phase reversal to the amplified signal. Accordingly, if the voltage amplifying stage 4A is comprised of a conventional operational amplifier, the input signal 60 is applied to the noninverting input terminal of the operational amplifier to thus avoid any phase reversal therein.

Resistor 8C couples amplified signal 61 to the voltage amplifying stage 4B and, together with resistor 9B, sufficiently attenuates signal 61 such that the voltage amplifier stage 4B is provided with an input signal having a magnitude that is substantially the same as the magnitude of input signal 60. If the voltage amplifying stage 4B is comprised of a conventional operational amplifier, the attenuated signal 61 is applied to the inverting input terminal thereof to thus permit a phase reversal therein. Alternatively, if the voltage amplifying stage 4B is not provided with an inverting input terminal, it is appreciated that a conventional phase reversing circuit may be provided so as to be selectively connected to the voltage amplifying stage 4B when the selecting switch 12 assumes position c. In either event, the voltage amplifying stage 4B together with the impedance converting stage 5B produces a phase reversed, amplified signal 62 having a magnitude that is substantially the same as the magnitude of the amplified signal 61 but admits of an opposite phase with respect thereto. The amplified signal 62 is applied to the signal output terminal 7B. Accordingly, if a suitable load is connected across the respective signal output terminals 7A and 7B, it is appreciated that the power amplifying device thus coupled to the load admits of a balanced transformerless connection. More particularly, when a maximum positive signal is applied to one side of the load connected to the signal output terminal 7A, a maximum negative signal is applied to the other side of the load connected to the signal output terminal 7B. Consequently, the load impedance may be readily supplied with a large amount of power.

A comparison of the power transfer capability of the exemplary configurations which may be adopted by the power amplifying device in accordance with the present invention is set forth hereinbelow in table A. The horizontal legend of the table represents typical impedances exhibited by a load supplied by the power amplifying device. The vertical legend of the table designates the three exemplary configurations that may be selected by the appropriate operation of the selecting switches 11–14, viz., individual amplifying circuits (i.e., 2-channel amplifier), a parallel connected amplifier and a balanced transformerless connection (BTL).

TABLE A

| Configuration | LOADING IMPEDANCE (OHMS) | | | |
| --- | --- | --- | --- | --- |
| | 2 | 4 | 8 | 16 |
| 2 - Channel | — | 40X2 Watts | 30X2 Watts | 25X2 Watts |
| Parallel | 80 Watts | 60 Watts | 50 Watts | — |
| BTL | — | — | 80 Watts | 60 Watts |

While the invention has been particularly shown and described with reference to a specific embodiment thereof capable of being selectively configured in exemplary amplifying circuits, it will be obivious to those skilled in the art that various changes and modifications in form and details may be made without departing from the spirit and scope of the invention. For example, the power amplifying device may be provided with multiple amplifying circuits 3A, 3B, 3C, ..., and need not be limited merely to the two illustrated amplifying circuits. Similarly, plural voltage amplifying stages and plural signal impedance converting stages may be provided in each amplifying circuit. Furthermore, each voltage amplifying stage as well as each impedance converting stage may be comprised of plural amplifying means and impedance converting means, respectively. Also, although the impedance converting means are described in an exemplary embodiment as emitter-follower circuits. It is appreciated that other circuits capable of performing the function described above for the impedance converting means may be readily employed. Thus, other class B amplifiers, power amplifiers and the like may be used.

Additionally, although FIG. 1 illustrates each of the selecting switches as comprising a movable contact connected to the amplifying circuit 3B and plural stationary contacts connected to the amplifying circuits 3A, it should be appreciated that the particular circuits to which the respective contacts are connected may be readily reversed. Also, and as described hereinabove the use of the illustrated selecting switches is merely exemplary. Other appropriate switch means may be provided such as mechanical switches, electronic switches, electromechanical switches, and the like. These switches may be manually operated or may be automatically controlled by further apparatus, not shown. It is, therefore, intended that appended claims be interpreted as including all of the foregoing and equivalent changes and modifications.

What is claimed is:

1. A power amplifier comprising; a plurality of voltage amplifying means each having at least one input terminal and an output terminal; a like plurality of signal impedance converting means, each coupled to an output terminal of a corresponding one of said voltage amplifying means; and a plurality of switching means having plural operable conditions for selectively interconnecting the input terminals of said voltage amplifying means to each other, for selectively interconnecting the output terminals of said voltage amplifying means to each other and for selectively interconnecting the outputs of said signal impedance converting means to each other, respectively, said switching means selectively establishing in a first condition, independent series circuits each comprised of a voltage amplifying means and a corresponding signal impedance converting means; in a second condition, parallel connected voltage amplifying means and signal impedance converting means; and in a third condition, balanced transformerless connections between a first voltage amplifying means and a first signal impedance converting means and a second voltage amplifying means and a second signal impedance converting means.

2. A power amplifier in accordance with claim 1 wherein said signal impedance converting means comprises emitter-follower amplifying means.

3. A power amplifier in accordance with claim 1 wherein said voltage amplifying means has a high output impedance.

4. A power amplifier comprising; a plurality of voltage amplifying means each having at least one input terminal and an output terminal; a like plurality of signal impedance converting means, each coupled to an output terminal of a corresponding one of said voltage amplifying means; a first switch exhibiting at least a first state for selectively coupling the input terminals of a first voltage amplifying means and a second voltage amplifying means in common relation to a signal input terminal and exhibiting at least a second state for selectively coupling the respective input terminals of said first and second voltage amplifying means in independent relation to separate signal input terminals; a second switch for selectively interconnecting the output terminals of said first and second voltage amplifying means and a third switch exhibiting at least a first state for selectively coupling the outputs of a first signal impedance converting means and a second signal impedance converting means in common relation to a signal output terminal and exhibiting at least a second state for selectively coupling said outputs of said first and second signal impedance converting means in independent relation to separate signal output terminals.

5. A power amplifier in accordance with claim 4 further comprising a fourth switch for selectively coupling the output of said first signal impedance converting means to an input terminal of said second voltage amplifying means.

6. A power amplifier in accordance with claim 5 wherein said first, second, third and fourth switches are adapted to be operated in unison such that when said first switch couples the input terminals of said first and second voltage amplifying means to the separate signal input terminals, said third switch couples the outputs of said first and second signal impedance converting means to the separate signal output terminals to thereby establish independent series circuits each comprised of a voltage amplifying means and a signal impedance converting means, and when said first switch couples the input terminals of said first and second voltage amplifying means in common relation to a signal input terminal, said second switch interconnects the output terminals of said first and second voltage amplifying means and said third switch couples the outputs of said first and second signal impedance converting means in common relation to a signal output terminal to thereby establish parallel connected voltage amplifying means and signal impedance converting means, and when said fourth switch couples the output of said first signal impedance converting means to an input of said second voltage amplifying means, said third switch couples the outputs of said first and second signal impedance converting means to the separate signal output terminals to thereby establish a balanced transformerless connection across said signal output terminals.

7. A power amplifier in accordance with claim 6 wherein said first switch comprises a first stationary contact coupled to a separate signal input terminal, a second stationary contact coupled to the input terminal of said first voltage amplifying means, a third stationary contact coupled a reference voltage and a movable contact coupled to a non-inverting input terminal of said second voltage amplifying means; said second switch comprises a first electrically isolated stationary contact, a stationary contact coupled to the output terminal of said first voltage amplifying means, a second electrically isolated stationary contact and a movable contact coupled to the output terminal of said second voltage amplifying means; and said third switch comprises a first stationary contact coupled to a separate signal output terminal, a second stationary contact coupled to the output of said first signal impedance converting means, a third stationary contact coupled to said separate signal output terminal, and a movable contact coupled to the output of said second signal impedance converting means.

8. A power amplifying device comprised of at least first and second amplifying circuits, each of said amplifying circuits including an input, at least one voltage amplifier stage, at least one power amplifier stage and an output, all connected in series; first and second signal input terminals and first and second signal output terminals; and multistate switch means coupled to said amplifying circuits for selectively interconnecting the stages of said amplifying circuits said switch means having a first state in which said first and second amplifying circuits are connected independently of each other between said first signal input and output terminals and between said second signal input and output terminals, respectively, and a second state in which said inputs of the first and second amplifying circuits are connected in parallel to one of said first and second signal input terminals and said outputs of the first and second amplifying circuits are connected in parallel to one of said first and second signal output terminals.

9. A power amplifying device in accordance with claim 8; wherein said switch means further has a third state for selectively connecting said output of the first amplifying circuit to an input of said second amplifying circuit and connecting the amplifying circuit outputs to respective signal output terminals to thereby selectively establish a balanced transformerless connection across said signal output terminals.

10. A power amplifying device in accordance with claim 9 wherein each voltage amplifier stage has a relatively high output impedance.

11. A power amplifying device in accordance with claim 10 wherein each power amplifier stage has a relatively high input impedance and a relatively low output impedance.

* * * * *